(12) United States Patent
Ichiroku et al.

(10) Patent No.: US 7,060,786 B2
(45) Date of Patent: Jun. 13, 2006

(54) HEAT RESISTANT RESIN COMPOSITION AND ADHESIVE FILM

(75) Inventors: Nobuhiro Ichiroku, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 233 days.

(21) Appl. No.: 10/430,309

(22) Filed: May 7, 2003

(65) Prior Publication Data

US 2003/0220455 A1    Nov. 27, 2003

(30) Foreign Application Priority Data

May 10, 2002 (JP) .............................. 2002-135505

(51) Int. Cl.
*C08G 59/68* (2006.01)
*C08L 63/02* (2006.01)

(52) U.S. Cl. ...................... 528/408; 528/418; 525/418; 525/423; 525/451; 525/523; 525/528

(58) Field of Classification Search ................ 525/523, 525/528, 423, 418, 451; 528/408, 418

See application file for complete search history.

(56) References Cited

U.S. PATENT DOCUMENTS

| | | | | |
|---|---|---|---|---|
| 4,463,147 A | * | 7/1984 | Diethelm et al. | 526/262 |
| 5,677,393 A | | 10/1997 | Ohmori et al. | |
| 6,063,943 A | * | 5/2000 | Ihm et al. | 549/525 |
| 6,235,865 B1 | * | 5/2001 | Shimizu et al. | 528/89 |
| 6,808,819 B1 | * | 10/2004 | Ichiroku et al. | 428/473.5 |
| 2004/0019174 A1 | * | 1/2004 | Ichiroku et al. | 528/25 |

FOREIGN PATENT DOCUMENTS

| | | |
|---|---|---|
| JP | 5-9254 A | 1/1993 |
| JP | 6-116517 A | 4/1994 |
| JP | 6-200216 A | 7/1994 |
| JP | 6-271673 A | 9/1994 |
| JP | 10-60111 A | 3/1998 |

* cited by examiner

*Primary Examiner*—Jeffrey B. Robertson
(74) *Attorney, Agent, or Firm*—Birch,Stewart,Kolasch & Birch,LLP

(57) ABSTRACT

A resin composition comprising the associated product of a polyimide resin having phenolic hydroxyl groups in the skeleton with an epoxy resin-curing catalyst, an epoxy resin having at least two glycidyl groups, and an epoxy resin-curing agent has a high bond strength, a low modulus of elasticity and heat resistance. An adhesive film comprising the resin composition is useful as an adhesive or sealant for printed circuit boards and semiconductor packages.

12 Claims, No Drawings

HEAT RESISTANT RESIN COMPOSITION AND ADHESIVE FILM

FIELD OF THE INVENTION

This invention relates to heat resistant resin compositions having a high bond strength, a low modulus of elasticity and heat resistance and suited as adhesives and sealants for various printed circuit boards and semiconductor packages, and adhesive films using the same.

BACKGROUND OF THE INVENTION

In concert with the current demand for electronic equipment of smaller size and more multi-functions, the interconnection technology of printed circuit boards and semiconductor packages seeks for a higher density and further miniaturization. As a result, adhesives and adhesive films are required to have sufficiently high heat resistance and low modulus to accommodate the high-temperature process during mounting and relieve thermal stresses upon installation of electronic parts.

In the prior art, low modulus materials were developed by introducing siloxane structures into polyimides and polyamide-imides which are heat resistant resins. These siloxane-modified polyamide-imides are disclosed in JP-A 5-009254 and JP-A 6-116517. However, these resins are less adherent to copper foil and less heat resistant.

JP-A 10-060111 and JP-A 6-271673 discloses to blend a siloxane-modified polyamide-imide with a compound having at least two maleimide groups for improving high-temperature properties. This resin composition is less adherent, especially to copper foil. Japanese Patent No. 3,221,756 corresponding to U.S. Pat. No. 5,677,393 discloses a heat resistant adhesive film comprising a polyimide silicone having phenolic hydroxyl groups and an epoxy resin. Since the phenolic hydroxyl groups are located at sterically dense positions and thus hindered from reacting with the epoxy resin, the bonding effect of hydroxyl groups that arises from the reaction of phenolic hydroxyl groups with the epoxy resin is not expectable.

SUMMARY OF THE INVENTION

An object of the present invention is to provide a heat resistant resin composition having improved adhesion, heat resistance, and a low modulus of elasticity, and an adhesive film using the same.

We have found that a resin composition comprising the associated product of a polyimide resin having phenolic hydroxyl groups in the skeleton with a curing catalyst for epoxy resin, an epoxy resin having at least two glycidyl groups in a molecule and a curing agent for the epoxy resin cures into a part having a low modulus of elasticity and improved adhesion and heat resistance. When the composition is applied to a support as varnish, an adhesive film is obtained which is fully adherent to copper foil or the like.

The term "adhesive film" as used herein preferably has a thickness of about 2 to about 1,000 μm, especially about 5 to about 500 μm and encompasses sheets.

Accordingly, the present invention provides a heat resistant resin composition comprising the associated product of a polyimide resin having phenolic hydroxyl groups in the skeleton with a curing catalyst for epoxy resin, an epoxy resin having at least two glycidyl groups in a molecule, and a curing agent for the epoxy resin. The curing catalyst for epoxy resin is typically a quaternary phosphorus catalyst.

An adhesive film obtained using the heat resistant resin composition is also provided.

DETAILED DESCRIPTION OF THE INVENTION

The heat resistant resin composition of the present invention comprises the associated product of a polyimide resin having phenolic hydroxyl groups in the skeleton, i.e., within the backbone consisting of recurring polyimide structures and/or at polyimide ends with an epoxy resin-curing catalyst, an epoxy resin having at least two glycidyl groups in a molecule and an epoxy resin-curing agent. By compounding a polyimide resin having improved heat resistance and electrical properties with an epoxy resin having at least two glycidyl groups in a molecule as a thermosetting resin and an epoxy resin-curing agent, a resin composition having improved bond strength and heat resistance is obtained.

The polyimide resin used herein is obtained by reacting a di- or more functional acid anhydride component with a mono- or more functional amine component having a phenolic hydroxyl group or with a mono- or more functional amine component having a phenolic hydroxyl group and a di- or more functional amine component free of a phenolic hydroxyl group.

The di- or more functional acid anhydride component used in the preparation of the polyimide resin is not critical, although a functionality of 2 is preferred for acid anhydrides and a functionality of 2, 3 or 4 is preferred for carboxylic acids and esters thereof. Suitable examples are tetracarboxylic acids, preferably containing 1 to 4 aromatic rings or dianhydrides thereof, including pyromellitic acid, 3,3',4,4'-benzophenonetetracarboxylic acid, 2,3,3',4'-biphenyltetracarboxylic acid, bis(3,4-carboxyphenyl)sulfone, 3,3',4,4'-biphenyltetracarboxylic acid, bis[4-(3,4-dicarboxyphenoxy)phenyl]-methane, bis[4-(3,4-dicarboxyphenoxy)phenyl]-ethane, 2,2-bis[4-(3,4-dicarboxyphenoxy)phenyl]-propane, bis(3,4-dicarboxyphenyl)difluoromethane, 2,2-bis(3,4-dicarboxyphenyl)hexafluoropropane, 1,3-bis(3,4-dicarboxyphenyl)-1,1,3,3-tetramethylsiloxane, bis[4-(3,4-dicarboxyphenoxy)phenyl]methane, and bis(3,4-dicarboxyphenyl) ether, as well as reactive derivatives of the foregoing such as esters of tetracarboxylic acids, alone or in admixture of any.

The mono- or more functional amine component having a phenolic hydroxyl group used in the preparation of the polyimide resin is not critical. Preferred examples include monofunctional amines having a phenolic hydroxyl group, as represented by the formulae below, to be introduced as a terminal group of polyimide, and polyfunctional (i.e., di- or more functional, preferably difunctional) amines having a phenolic hydroxyl group, to be introduced into the backbone skeleton consisting of recurring polyimide structures. They may be used alone or in admixture of any.

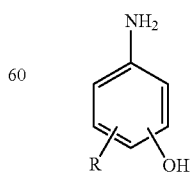

Herein, R is a hydrogen atom, a halogen atom such as fluorine, bromine or iodine, or a unsubstituted or halo-substituted monovalent hydrocarbon group of 1 to 8 carbon atoms, such as alkyl, alkenyl, alkynyl, trifluoromethyl and phenyl.

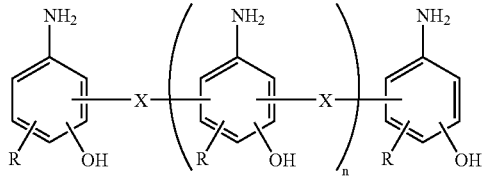

Herein, R is a hydrogen atom, a halogen atom such as fluorine, bromine or iodine, or a unsubstituted or halo-substituted monovalent hydrocarbon group of 1 to 8 carbon atoms, such as alkyl, alkenyl, alkynyl, trifluoromethyl and phenyl, the substituent groups R on the respective aromatic rings may be the same or different; X is a single bond or any of the following:

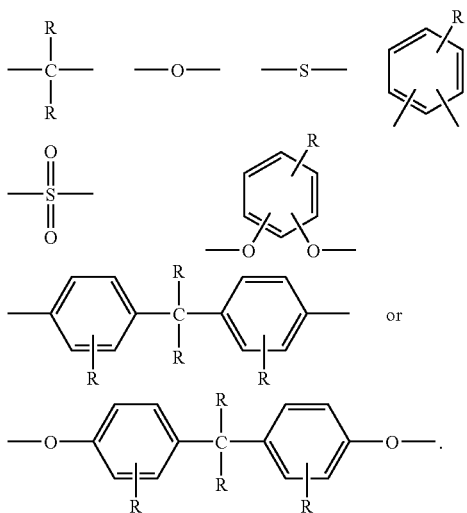

The subscript n is an integer of 0 to 5.

Of the hydrocarbon groups represented by R, suitable alkyl groups are those of 1 to 8 carbon atoms, including methyl, ethyl, propyl, isopropyl, butyl, isobutyl, tert-butyl, pentyl, neopentyl, hexyl, cyclohexyl, and octyl; suitable alkenyl groups are those of 2 to 6 carbon atoms, including vinyl, allyl, propenyl, isopropenyl, butenyl, hexenyl, and cyclohexenyl; and suitable alkynyl groups are those of 2 to 6 carbon atoms, including ethynyl, propynyl, butynyl and hexynyl.

When X is a single bond,

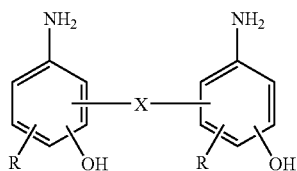

is represented as

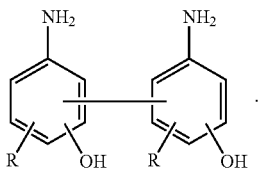

In some embodiments, any desired di- or more functional amine component free of a phenolic hydroxyl group, other than the aforementioned amine component having a phenolic hydroxyl group, is used in the preparation of the polyimide resin. It is preferably a difunctional amine component having 1 to 4 aromatic rings. Preferred examples include 4,4'-diaminodiphenylmethane, o-, m- or p-phenylenediamine, bis(4-(3-aminophenoxy)phenyl)sulfone, 2,4-diaminotoluene, 2,5-diaminotoluene, 2,4-diaminoxylene, 2,4-diaminodurene, dimethyl-4,4'-diaminodiphenyl, dialkyl-4,4'-diaminodiphenyls, dimethoxy-4,4'-diaminodiphenyl, diethoxy-4,4'-diaminodiphenyl, 4,4'-diaminodiphenyl ether, 3,4'-diaminodiphenyl ether, 4,4'-diaminodiphenylsulfone, 3,3'-diaminodiphenylsulfone, 4,4'-diaminobenzophenone, 3,3'-diaminobenzophenone, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis(4-(4-aminophenoxy)phenyl)sulfone, 2,2'-bis(4-(4-aminophenoxy)phenyl)propane, 2,2-bis(4-(4-aminophenoxy)phenylhexafluoropropane, 2,2-bis(4-(3-aminophenoxy)phenyl)propane, 2,2-bis(4-(3-aminophenoxy)phenyl)hexafluoropropane, 2,2-bis(4-(4-amino-2-trifluoromethylphenoxy)phenyl)hexafluoropropane, 2,2-bis(4-(3-amino-5-trifluoromethylphenoxy)phenyl)hexafluoropropane, 2,2-bis(4-aminophenyl)hexafluoropropane, 2,2-bis(3-aminophenyl)hexafluoropropane, 2,2-bis(3-amino-4-hydroxyphenyl)hexafluoropropane, 2,2-bis(3-amino-4-methylphenyl)hexafluoropropane, 4,4'-bis(4-aminophenoxy)octafluorobiphenyl, 2,2'-bis(trifluoromethyl)diaminodiphenyl, 3,5-diaminobenzotrifluoride, 2,5-diaminobenzotrifluoride, 3,3'-bistrifluoromethyl-4,4'-diaminobiphenyl, 3,3'-bistrifluoromethyl-5,5'-diaminobiphenyl, bis(trifluoromethyl)-4,4'-diaminodiphenyl, bis(fluorinated alkyl)-4,4'-diaminodiphenyls, dichloro-4,4'-diaminodiphenyl, dibromo-4,4'-diaminodiphenyl, bis(fluorinated alkoxy)-4,4'-diaminodiphenyls, diphenyl-4,4'-diaminodiphenyl, 4,4'-bis(4-aminotetrafluorophenoxy)tetrafluorobenzene, 4,4'-bis(4-aminotetrafluorophenoxy)octafluorobiphenyl, 4,4'-bisnaphthylamine, 4,4'-diaminobenzanilide, and 4,4'-diamino(N-alkyl)benzanilides, alone or in admixture of any.

It is understood that a siloxane structure may be introduced into the polyimide resin of the invention for adjusting a modulus of elasticity and imparting flexibility and solubility. Suitable di- or more functional (preferably difunctional) amine components having a siloxane structure introduced therein include siloxydiamines, diamino(poly)siloxanes, and the like. Illustrative, non-limiting examples of the siloxydiamine include 1,3-bis(3-aminopropyl)-1,1,2,2-tetramethyldisiloxane, 1,3-bis(3-aminobutyl)-1,1,2,2-tetramethyldisiloxane, bis(4-aminophenoxy)dimethylsilane, and 1,3-bis(4-aminophenoxy)tetramethyldisiloxane.

The diamino(poly)siloxanes include, for example, those of the following general formula:

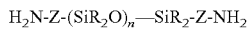

wherein Z is selected from divalent hydrocarbon groups including $C_{1-8}$ alkylene groups which may contain an ether bond oxygen atom (e.g., methylene, ethylene, trimethylene, methylethylene, tetramethylene and hexamethylene), arylene groups (e.g., phenylene and tolylene), oxyalkylene groups, oxyarylene groups and combinations thereof such as alkylene-arylene and oxyalkylene-arylene; R is independently selected from among $C_{1-8}$ alkyl or alkoxy groups which may be branched, and phenyl groups which may be substituted; and n is an integer of 2 to 100, preferably 4 to 60.

Examples of the alkylene group represented by Z include ethylene, propylene (trimethylene), butylene (tetramethylene), pentamethylene, and hexamethylene. Examples of the alkyl group represented by R include methyl, ethyl, propyl, isopropyl, butyl, isobutyl, tert-butyl, pentyl, neopentyl, hexyl, cyclohexyl, and octyl; and examples of the alkoxy group represented by R include methoxy, ethoxy, propoxy, butoxy, tert-butoxy and pentoxy.

The diamino(poly)siloxane is preferably used in such amounts that the siloxane component may account for 1 to 50 mol %, more preferably 2 to 40 mol % of the resulting polyimide resin. Less than 1 mol % of the siloxane component may be ineffective for imparting flexibility whereas more than 50 mol % of the siloxane component may increase moisture permeability and have an adverse impact on heat resistance.

In the preparation of the polyimide resin having phenolic hydroxyl groups in the skeleton, i.e., within the polyimide backbone and/or at polyimide ends, the amine component (mono- or more functional amine component having a phenolic hydroxyl group and optionally, di- or more functional amine component free of a phenolic hydroxyl group) and the acid anhydride component are preferably reacted in such amounts that the molar ratio (or equivalent ratio) of amino groups in the amine component to acid anhydride groups in the acid anhydride components may fall in the range of 0.95 to 1.05 and more preferably from 0.98 to 1.02. Note that in the case of carboxylic acid groups or ester groups, 2 moles correspond to one equivalent.

Also in the practice of the invention, the amine component having a phenolic hydroxyl group is preferably used in an amount of 1 to 50 mol %, more preferably 2 to 50 mol %, especially 5 to 50 mol % of the entire monomeric components to constitute the polyimide resin (that is, the total of mono- or more functional amine component having a phenolic hydroxyl group, di- or more functional amine component free of a phenolic hydroxyl group, and acid anhydride component). Since the present invention relies on curing reaction utilizing the reaction of phenolic hydroxyl groups in the polyimide resin with epoxy groups in the epoxy resin, too small an amount of the amine component having a phenolic hydroxyl group offers less crosslink points between the polyimide resin and the epoxy resin, which may detract from adhesion and heat resistance.

The polyimide resin having phenolic hydroxyl groups in the skeleton, i.e., within the backbone consisting of recurring polyimide structures and/or at polyimide ends can be prepared, for example, by previously feeding the amine component (mono- or more functional amine component having a phenolic hydroxyl group and optional di- or more functional amine component free of a phenolic hydroxyl group) and the acid anhydride component into a reactor, adding a solvent thereto, and heating. Preferably, in the reaction vessel, the amine component is dispersed or dissolved in the solvent, and the acid anhydride component dissolved or dispersed in the solvent is added dropwise at low temperature, followed by agitation and subsequent heating.

The solvents used in the preparation of the polyimide resin include commonly used solvents having a high dissolving power, for example, amide solvents such as N-methylpyrrolidone, N,N-dimethylformamide and N,N-dimethylacetamide; and oxygen-containing solvents, for example, lactones such as γ-butyrolactone, α-methyl-γ-butyrolactone, γ-valerolactone, δ-valerolactone, γ-caprolactone, and ε-caprolactone. Also included are carbonates such as ethylene carbonate and propylene carbonate, esters such as butyl acetate, ethyl cellosolve acetate and butyl cellosolve acetate, ethers such as dibutyl ether, diethylene glycol dimethyl ether, and triethylene glycol dimethyl ether, ketones such as methyl isobutyl ketone, cyclohexanone and acetophenone, alcohols such as butanol, octanol and ethyl cellosolve, as well as chain-like or cyclic amides, ureas, sulfoxides, sulfones, hydrocarbons and halogenated solvents. Any of these solvents may be added in such amounts that it does not adversely affect the stability of the resulting polyimide resin.

The other component used to form the associated product with the polyimide resin is a curing catalyst for epoxy resin. The curing catalyst is typically selected from quaternary organophosphorus catalysts. The quaternary organophosphorus catalysts are not critical as long as they have a chemical structure that can associate with phenolic hydroxyl groups. Preferred catalysts are aromatic derivatives of quaternary phosphorus-boron salts having aromatic substituents on boron, that is, tetraorganophosphonium tetraorganoborates such as tetraarylphosphonium tetraarylborates, for example, compounds shown by the following formula. They may be used alone or in admixture of two or more.

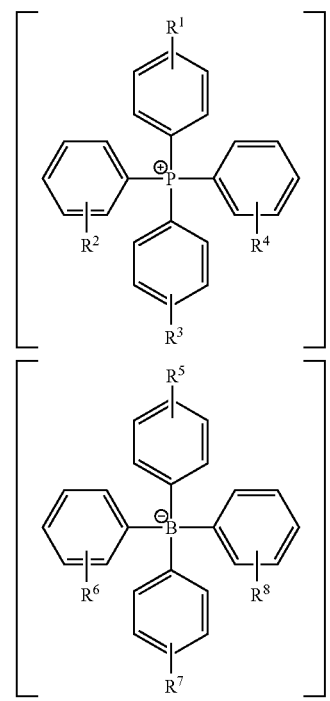

In the formula, $R^1$ to $R^8$ are selected from hydrogen atoms, halogen atoms such as fluorine, bromine and iodine, and unsubstituted or halo-substituted monovalent hydrocarbon groups which may contain an oxygen atom, such as $C_{1-8}$ alkyl, alkenyl, alkynyl, $C_{1-8}$ alkoxy, trifluoromethyl, and aryl (typically phenyl). All the substituent groups may be the same or different.

Of the hydrocarbon groups represented by $R^1$ to $R^8$, suitable alkyl groups include methyl, ethyl, propyl, isopropyl, butyl, isobutyl, tert-butyl, pentyl, neopentyl, hexyl, cyclohexyl and octyl; suitable alkenyl groups include vinyl, allyl, propenyl, isopropenyl, butenyl, hexenyl and cyclohexenyl; suitable alkynyl groups include ethynyl, propynyl, butynyl and hexynyl; and suitable alkoxy groups include methoxy, ethoxy, propoxy, butoxy, tert-butoxy and pentoxy.

Examples of the quaternary phosphorus compound include tetraphenylphosphonium tetraphenylborate, tetra-p-toluylphosphonium tetraphenylborate, and the following.

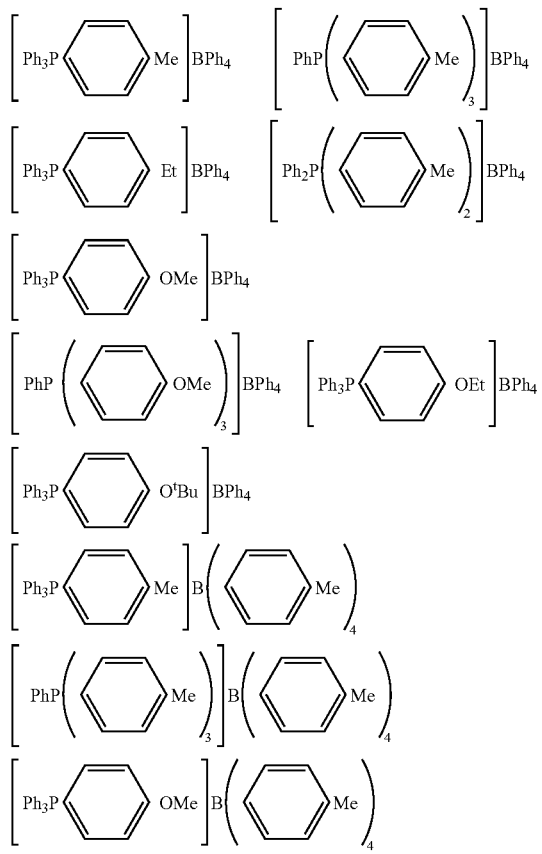

Herein, Me, Et, Bu and Ph denote methyl, ethyl, butyl and phenyl, respectively.

An appropriate amount of the epoxy resin-curing catalyst added is 0.1 to 15 parts by weight, more preferably 0.2 to 10 parts by weight per 100 parts by weight of the polyimide resin. Too small an amount of the curing catalyst may result in under-cure and require a very high temperature to achieve curing whereas too large an amount of the curing catalyst may adversely affect the shelf stability of the resulting adhesive.

One exemplary method for the preparation of the associated product of the polyimide resin with the epoxy resin-curing catalyst involves the steps of adding the polyimide resin having phenolic hydroxyl groups and the epoxy resin-curing catalyst to a solvent as mentioned above, and agitating the mixture at room temperature (~20° C.) for about 30 minutes to 8 hours. If the reaction proceeds slowly, the reaction mixture may be heated up to about 160° C. Preferred reaction conditions include a temperature of about 20 to 160° C. and a time of about 30 minutes to 8 hours, especially about 60 to 150° C. and about 1 to 4 hours. During the reaction, phenolic hydroxyl groups in the polyimide resin associate with the curing catalyst to form an associated product.

The epoxy resin used herein is not critical as long as it has at least two glycidyl groups in a molecule. Examples include glycidyl type (inclusive of methylglycidyl type) epoxy resins, for example, glycidyl ethers of phenols such as bisphenol resins (e.g., bisphenol A, bisphenol F), resorcinol, and novolak phenolic resins (e.g., phenol novolak, cresol novolak), glycidyl ethers of alcohols such as butane diol, polyethylene glycol, and polypropylene glycol, glycidyl esters of carboxylic acids such as phthalic acid, isophthalic acid and tetrahydrophthalic acid, derivatives of aniline and isocyanuric acid in which active hydrogen attached to the nitrogen atom is substituted with a glycidyl group; alicyclic epoxy resins obtained by epoxidizing olefin bonds within the molecule, such as vinylcyclohexene diepoxide, 3,4-epoxy-cyclohexylmethyl-3,4-epoxycyclohexanecarboxylate, and 2-(3,4-epoxy)cyclohexyl-5,5-spiro(3,4-epoxy)cyclohexane-m-dioxane; glycidyl ethers of p-xylylene-modified phenolic resins, glycidyl ethers of m-xylylene/p-xylylene-modified phenolic resins, glycidyl ethers of terpene-modified phenolic resins, glycidyl ethers of dicyclopentadiene-modified phenolic resins, glycidyl ethers of cyclopentadiene-modified phenolic resins, glycidyl ethers of polycyclic aromatic-modified phenolic resins, glycidyl ethers of naphthalene ring-containing phenolic resins, biphenyl type epoxy resins, triphenol alkane type epoxy resins, phenol aralkyl type epoxy resins and biphenyl aralkyl type epoxy resins. These resins may be used alone or in admixture of two or more.

The epoxy resin-curing agent is not critical as long as it serves to cure the epoxy resin. Suitable curing agents include compounds having one or more functional groups such as acid anhydride, phenolic hydroxyl or amino groups in a molecule, for example, phenolic compounds (phenolic resins), acid anhydrides and amine compounds, with the phenolic compounds being preferred. Exemplary phenolic compounds include phenols such as phenol, cresol, xylenol, hydroquinone, resorcinol, catechol, bisphenol resins (e.g., bisphenol A, bisphenol F), naphthalene ring-bearing phenolic resins obtained by condensing or co-condensing naphthols such as α-naphthol, β-naphthol and dihydroxynaphthalene, with aldehydes such as formaldehyde, acetaldehyde, propionaldehyde, benzaldehyde and salicylaldehyde, in the presence of acidic catalysts; novolak phenolic resins such as phenol novolak and cresol novolak; xylylene skeleton-bearing phenolic resins synthesized from phenols and dimethoxy-p-xylene or the like; phenolic resins having a dicyclopentadiene skeleton; phenolic resins having a cyclopentadiene skeleton; melamine-modified phenolic resins; terpene-modified phenolic resins; polycyclic aromatic-modified phenolic resins; and naphthol resins having a xylylene skeleton, triphenolalkane resins, biphenyl resins, phenol aralkyl resins and biphenyl aralkyl resins. These may be used alone or in admixture of two or more.

The epoxy resin-curing agent may be compounded with the epoxy resin in any desired proportion. When the curing agent used is a phenolic compound, it is preferably added in such amounts that the molar ratio of phenolic hydroxyl groups in the phenolic compound to epoxy groups in the epoxy resin is from 0.01 to 0.99, especially from 0.02 to 0.80.

According to the invention, curing reaction can be carried out by utilizing the reaction of phenolic hydroxyl groups with epoxy groups as mentioned above. Too small an amount of epoxy groups may lead to an insufficient bonding force to the adherend whereas too large an amount of epoxy groups, which means the presence of an excess of the epoxy resin by which a modulus of elasticity is increased, may prevent formation of a flexible adhesive sheet. For this reason, the associated product, the epoxy resin and the epoxy resin-curing agent are preferably blended such that the total amount of the epoxy resin and the epoxy resin-curing agent is about 1 to 900 parts by weight, especially about 5 to 400 parts by weight per 100 parts by weight of the associated product.

According to the invention, the associated product and the epoxy resin-curing agent are used as the components that cause the epoxy resin to cure. The chemical equivalent ratio between them is not critical although it is preferred that the equivalent ratio of epoxy groups in the epoxy resin to the total of phenolic hydroxyl groups in the polyimide resin+ cure effective groups in the epoxy resin-curing agent+ effective groups in the epoxy resin-curing catalyst be set in the the range from 0.7 to 1.3, especially from 0.8 to 1.2. Controlling the ratio within this range can minimize unreacted residues of the components and thus suppress age degradation of adhesion, moisture absorption and electrical properties. The term "cure effective groups" is used herein to encompass, for example, phenolic hydroxyl groups in phenolic resins, and amino groups, amide groups and imidazole rings in amines.

Any other additives may be included in the heat resistant resin composition of the invention as long as they do not compromise the objects of the invention.

The heat resistant resin composition of the invention is prepared by compounding the associated product of polyimide resin with epoxy resin-curing catalyst, the epoxy resin, the epoxy resin-curing agent and other additives and thoroughly agitating and milling the mixture for 5 minutes or longer in order to prevent separation of the components.

The heat resistant resin composition thus obtained is dissolved in an aprotic polar solvent such as N-methylpyrrolidone (NMP) and directly used as varnish. When the composition in solution form is coated onto a support, there is obtained an adhesive film which is fully adherent to copper foil or the like. The adhesive film can be pressed together with a copper foil to produce a copper clad laminate having excellent adhesion and soldering heat resistance.

It is noted that the thickness of the adhesive film is usually 2 to 1,000 μm, preferably 5 to 500 μm, especially 5 to 100 μm, though not critical.

The adhesive film of the invention can be cured by heating at a temperature of 160° C. or higher, preferably 200° C. or higher.

EXAMPLE

Synthesis examples and examples of the invention are given below by way of illustration, and are not intended to limit the scope of the invention.

The abbreviations used herein are as follows.
HAB: 4,4'-(3,3'-dihydroxy)diaminobiphenyl
6FDA: 2,2-bis(3,4-dicarboxyphenyl)hexafluoropropane dianhydride Synthesis Example 1

A 1-liter separable flask equipped with a reflux condenser coupled to a cocked 25-ml metering water container, thermometer and stirrer was charged with 3.72 parts by weight of an aromatic diamine having a phenolic hydroxyl group, HAB, 58.01 parts by weight of a diaminosiloxane KF-8010 (by Shin-Etsu Chemical Co., Ltd., both end γ-aminopropyldimethylsiloxy-blocked dimethylpolysiloxane) and 200 parts by weight of cyclohexanone as a reaction solvent. The diamine was dispersed in the solvent by agitating at 80° C. Then a solution containing 38.27 parts by weight of 6FDA as an acid anhydride in 100 parts by weight of cyclohexanone was added dropwise to the solution, which was agitated for 8 hours at 80° C. for reaction. Thereafter, 25 ml of toluene was added and the temperature was then raised to about 160° C. at which reflux was continued for 2 hours. After it was confirmed that a predetermined amount of water collected in the metering water container and the outflow of water ceased, the toluene was completely removed at 160° C. while emptying the metering water container of the effluent. This yielded about 400 parts by weight of a cyclohexanone solution of a polyimide resin having phenolic hydroxyl groups in the skeleton.

Synthesis Examples 2–5

Aside from dissolving an amount shown in Table 1 of a diamine (siloxanediamine KF-8010 by Shin-Etsu Chemical Co., Ltd. and/or aromatic diamine, HAB) in 200 parts by weight of cyclohexanone, about 400 parts by weight of a cyclohexanone solution of a polyimide resin was prepared according to Synthesis Example 1.

For the cyclohexanone solutions of polyimide resins obtained in Synthesis Examples 1 to 5, a glass transition temperature and Young's modulus were measured by the following methods. The results are shown in Table 1.

Glass Transition Temperature (Tg)

The polyimide resin solution was coated onto a Teflon® film and dried at 80° C. for 30 minutes to form a film of 50 μm thick. The film was then peeled from the Teflon® film, secured to a stainless steel frame, and heat treated at 175° C. for one hour for drying and curing. The cured film of 20 mm×5 mm×50 μm (thick) was measured for Tg. Using a thermo-mechanical analyzer TMA-2000 (ULVAC Inc.), Tg was measured in the tensile mode under conditions: a chuck-to-chuck distance of 15 mm, a measuring temperature range of 25 to 300° C., a heating rate of 10° C./min, and a load of 10 g.

Young's Modulus

The polyimide resin solution was coated onto a Teflon® film and dried at 80° C. for 30 minutes to form a film of 50 μm thick. The film was then peeled from the Teflon® film, secured to a stainless steel frame, and heat treated at 175° C. for one hour for drying and curing. The cured adhesive film of 20 mm×5 mm×50 μm (thick) was measured for dynamic viscoelasticity. Using a dynamic viscoelasticity meter, Young's modulus at 25° C. was measured in the tensile mode under conditions: a chuck-to-chuck distance of 15 mm, a measuring temperature range of 20 to 300° C., a heating rate of 5° C./min, and a frequency of 30 Hz.

TABLE 1

| Amount | Synthesis Example | | | | |
|---|---|---|---|---|---|
| (pbw) | 1 | 2 | 3 | 4 | 5 |
| 6FDA | 38.27 | 45.65 | 67.27 | 34.54 | 34.88 |
|  | (50 mol %) | (50 mol %) | (50 mol %) | (50 mol %) | (50 mol %) |
| KF-8010 | 58.01 | 43.25 | 0.00 | 65.46 | 64.78 |
|  | (40 mol %) | (25 mol %) | (0 mol %) | (50 mol %) | (49 mol %) |
| HAB | 3.72 | 11.10 | 32.73 | 0.00 | 0.34 |
|  | (10 mol %) | (25 mol %) | (50 mol %) | (0 mol %) | (1 mol %) |
| cyclo-hexanone | 300.00 | 300.00 | 300.00 | 300.00 | 300.00 |
| Measurement results |  |  |  |  |  |
| Tg (° C.) | 50 | 90 | 220 | 40 | 40 |
| Young's modulus (MPas) | 300 | 700 | 2400 | 100 | 100 |

Note that Synthesis Examples 1 to 5 are abbreviated as SE1 to SE5, respectively. In the following Examples, TPP-K is tetraphenylphosphonium tetraphenylborate, and TPTP-K is tetra-p-toluylphosphonium tetraphenylborate.

Example 1

To 200 parts by weight of the cyclohexanone solution of polyimide resin obtained in Synthesis Example 1 (about 50 parts by weight of solids) was added 1.00 part by weight of a quaternary phosphorus compound TPP-K as an epoxy resin-curing catalyst. The ingredients were stirred at 150° C. for 2 hours, during which the initially brown turbid solution turned to be a brown clear liquid. There was obtained a cyclohexanone solution of the polyimide resin associated with the quaternary phosphorus compound.

To the solution, an o-cresol novolak epoxy resin EOCN 1020 (by Nippon Kayaku Co. Ltd., epoxy equivalent: 220 g/Eq) and a phenol novolak resin TD-2131 (Dainippon Ink & Chemicals Inc., phenolic hydroxyl group equivalent: 110 g/Eq) were added in amounts shown in Table 2. They were agitated to give a heat resistant resin composition.

The composition was examined for Tg, Young's modulus, copper-polyimide bond strength (peeling bond strength) and 5% weight loss temperature by the methods shown below. The results are also shown in Table 2.

Examples 2 to 7

A quaternary phosphorus compound TPP-K as an epoxy resin-curing catalyst was added to each of the cyclohexanone solutions of polyimide resin obtained in Synthesis Examples 1 to 3 in the amounts as shown in Table 2. The ingredients were stirred at 150° C. for 2 hours, during which the initially brown turbid solution turned to be a brown clear liquid. There was obtained a cyclohexanone solution of the polyimide resin associated with the quaternary phosphorus compound.

To the solution, the o-cresol novolak epoxy resin EOCN 1020 and the phenol novolak resin TD-2131 were added in the amounts shown in Table 2. They were agitated to give a heat resistant resin composition.

These compositions were examined for Tg, Young's modulus, copper-polyimide bond strength (peeling bond strength) and 5% weight loss temperature. The results are also shown in Table 2.

Example 8

To 200 parts by weight of the cyclohexanone solution of polyimide resin obtained in Synthesis Example 1 (about 50 parts by weight of solids) was added 1.00 part by weight of a quaternary phosphorus compound TPTP-K as an epoxy resin-curing catalyst. The ingredients were stirred at 150° C. for 2 hours, during which the initially brown turbid solution turned to be a brown clear liquid. There was obtained a cyclohexanone solution of the polyimide resin associated with the quaternary phosphorus compound.

To the solution, an o-cresol novolak epoxy resin EOCN 1020 (by Nippon Kayaku Co. Ltd., epoxy equivalent: 220 g/Eq) and a phenol novolak resin TD-2131 (Dainippon Ink & Chemicals Inc., phenolic hydroxyl group equivalent: 110 g/Eq) were added in amounts shown in Table 3. They were agitated to give a heat resistant resin composition.

The composition was examined for Tg, Young's modulus, copper-polyimide bond strength (peeling bond strength) and 5% weight loss temperature by the methods shown below. The results are also shown in Table 3.

Examples 9 to 12

A quaternary phosphorus compound TPTP-K as an epoxy resin-curing catalyst was added to the cyclohexanone solution of polyimide resin obtained in Synthesis Example 1 in the amounts as shown in Table 3. The ingredients were stirred at 150° C. for 2 hours, during which the initially brown turbid solution turned to be a brown clear liquid. There was obtained a cyclohexanone solution of the polyimide resin associated with the quaternary phosphorus compound.

To the solution, the o-cresol novolak epoxy resin EOCN 1020 and the phenol novolak resin TD-2131 were added in the amounts shown in Table 3. They were agitated to give a heat resistant resin composition.

These compositions were examined for Tg, Young's modulus, copper-polyimide bond strength (peeling bond strength) and 5% weight loss temperature. The results are also shown in Table 3.

Comparative Examples 1 to 7

To each of the cyclohexanone solutions of polyimide resin obtained in Synthesis Examples 1 to 3 were added the quaternary phosphorus compound TPP-K, the o-cresol novolak epoxy resin EOCN 1020 and the phenol novolak resin TD-2131 in the amounts shown in Table 4. The ingredients were agitated at room temperature for 2 hours. At the end of agitation, the solution remained brown turbid. There was obtained a heat resistant resin composition in the state that the quaternary phosphorus compound, epoxy resin, phenolic resin and polyimide resin were dispersed in cyclohexanone solution.

These compositions were examined for Tg, Young's modulus, copper-polyimide bond strength (peeling bond strength) and 5% weight loss temperature. The results are shown in Table 4.

Comparative Examples 8 to 14

A quaternary phosphorus compound TPP-K as an epoxy resin-curing catalyst was added to each of the cyclohexanone solutions of polyimide resin obtained in Synthesis Examples 4 and 5 in the amounts as shown in Table 5. The ingredients were stirred at 160° C. for 2 hours, after which the solution remained brown turbid. There was obtained a cyclohexanone solution of the polyimide resin and the quaternary phosphorus compound.

To the solution, the o-cresol novolak epoxy resin EOCN 1020 and the phenol novolak resin TD-2131 were added in the amounts shown in Table 5. They were agitated to give a heat resistant resin composition.

These compositions were examined for Tg, Young's modulus, copper-polyimide bond strength (peeling bond strength) and 5% weight loss temperature. The results are also shown in Table 5.

Glass Transition Temperature (Tg)

The heat resistant resin compositions obtained in Examples 1–12 and Comparative Examples 1–14 each were coated onto a Teflon® film and dried at 80° C. for 30 minutes to form a film of 50 μm thick. The adhesive film was then peeled from the Teflon® film, secured to a stainless steel frame, and heat treated at 175° C. for one hour for drying and curing. The cured film of 20 mm×5 mm×50 μm (thick) was measured for Tg. Using a thermo-mechanical analyzer TMA-2000 (ULVAC Inc.), Tg was measured in the tensile mode under conditions: a chuck-to-chuck distance of 15 mm, a measuring temperature range of 25 to 300° C., a heating rate of 10° C./min, and a load of 10 g.

Young's Modulus

The heat resistant resin composition obtained in Examples 1–12 and Comparative Examples 1–14 each were coated onto a Teflon® film and dried at 80° C. for 30 minutes to form a film of 50 μm thick. The adhesive film was then peeled from the Teflon® film, secured to a stainless steel frame, and heat treated at 175° C. for one hour for drying and curing. The cured film of 20 mm×5 mm×50 μm (thick) was measured for dynamic viscoelasticity. Using a dynamic viscoelasticity meter, Young's modulus at 25° C. was measured in the tensile mode under conditions: a chuck-to-chuck distance of 15 mm, a measuring temperature range of 20 to 300° C., a heating rate of 5° C./min, and a frequency of 30 Hz.

Copper-Polyimide Bond Strength

The heat resistant resin composition obtained in Examples 1–12 and Comparative Examples 1–14 each were coated onto a Teflon® film and dried at 80° C. for 30 minutes to form a film of 50 μm thick. The adhesive film was then peeled from the Teflon® film and sandwiched between a polyimide film and a copper foil. Under a pressure, the sandwich was passed twice between laminating rolls heated at 115° C. for press bonding. The press bonded laminate was heat treated in a nitrogen stream at 80° C. for 3 hours, at 120° C. for 2 hours, at 150° C. for 2 hours, and at 180° C. for 3 hours for thereby curing the flame-retardant, heat resistant resin layer. The copper foil of the laminate was etched to produce a test piece complying with JIS C-6471, which was measured for bond strength.

The heat resistant film substrate used herein was a polyimide film of 25 μm thick, Kapton 100V by Dupont-Toray Co., Ltd. The copper foil used herein was a rolled copper foil of 35 μm thick, BHY22BT by Japan Energy Co., Ltd. The bond strength was measured using a tensile tester (Shimadzu Mfg. Co., Ltd.) at a pulling rate of 50 mm/min. A rotating drum type jig was used in 90 degree direction pulling.

5% Weight Loss Temperature

The heat resistant resin compositions obtained in Examples 1–12 and Comparative Examples 1–14 each were coated onto a Teflon® film and dried at 80° C. for 30 minutes to form a film of 50 μm thick. The film was then peeled from the Teflon® film, secured to a stainless steel frame, and heat treated at 175° C. for one hour for drying and curing. Using a thermogravimetric analyzer TGD-7000 (ULVAC Inc.), the temperature at which a weight loss of 5% by weight was marked was measured under conditions: a measuring temperature range of 25 to 400° C., a heating rate of 10° C./min, a sample weight of 20 mg and nitrogen stream.

TABLE 2

| Amount (pbw) | Example | | | | | | |
| --- | --- | --- | --- | --- | --- | --- | --- |
| | 1 | 2 | 3 | 4 | 5 | 6 | 7 |
| EOCN1020 | 36.43 | 63.04 | 18.70 | 33.77 | 36.77 | 43.77 | 33.93 |
| TD2131 | 12.57 | 30.96 | 0.30 | 11.23 | 12.73 | 5.23 | 15.07 |
| TPP-K | 1.00 | 1.00 | 1.00 | 5.00 | 0.50 | 1.00 | 1.00 |
| SE1 solids | 50.00 | 5.00 | 80.00 | 50.00 | 50.00 | | |
| SE2 solids | | | | | | 50.00 | |
| SE3 solids | | | | | | | 50.00 |
| Measurement results | | | | | | | |
| Tg (° C.) | 115 | 135 | 90 | 115 | 110 | 135 | 200 |
| Young's modulus (MPas) | 1400 | 2400 | 700 | 1350 | 1350 | 1600 | 2450 |
| Bond strength (kgf/cm) | 1.2 | 1.3 | 0.9 | 1.2 | 1.1 | 1.2 | 1.0 |
| 5% weight loss temperature (° C.) | 330 | 315 | 350 | 335 | 330 | 330 | 390 |

TABLE 3

| Amount (pbw) | Example | | | | |
|---|---|---|---|---|---|
| | 8 | 9 | 10 | 11 | 12 |
| EOCN1020 | 36.43 | 63.04 | 18.70 | 33.77 | 36.77 |
| TD2131 | 12.57 | 30.96 | 0.30 | 11.23 | 12.73 |
| TPTP-K | 1.00 | 1.00 | 1.00 | 5.00 | 0.50 |
| SE1 solids | 50.00 | 5.00 | 80.00 | 50.00 | 50.00 |
| SE2 solids | | | | | |
| SE3 solids | | | | | |
| Measurement results | | | | | |
| Tg (° C.) | 120 | 138 | 96 | 121 | 117 |
| Young's modulus (MPas) | 1450 | 2390 | 790 | 1380 | 1390 |
| Bond strength (kgf/cm) | 1.2 | 1.3 | 0.9 | 1.2 | 1.1 |
| 5% weight loss temperature (° C.) | 330 | 315 | 350 | 335 | 330 |

TABLE 4

| Amount (pbw) | Comparative Example | | | | | | |
|---|---|---|---|---|---|---|---|
| | 1 | 2 | 3 | 4 | 5 | 6 | 7 |
| EOCN1020 | 36.43 | 63.04 | 18.70 | 33.77 | 36.77 | 43.77 | 33.93 |
| TD2131 | 12.57 | 30.96 | 0.30 | 11.23 | 12.73 | 5.23 | 15.07 |
| TPP-K | 1.00 | 1.00 | 1.00 | 5.00 | 0.50 | 1.00 | 1.00 |
| SE1 solids | 50.00 | 5.00 | 80.00 | 50.00 | 50.00 | | |
| SE2 solids | | | | | | 50.00 | |
| SE3 solids | | | | | | | 50.00 |
| Measurement results | | | | | | | |
| Tg (° C.) | 85 | 115 | 65 | 85 | 85 | 105 | 170 |
| Young's modulus (MPas) | 1400 | 2400 | 740 | 1400 | 1400 | 1600 | 2450 |
| Bond strength (kgf/cm) | 1.0 | 1.3 | 0.8 | 1.0 | 1.0 | 1.0 | 0.8 |
| 5% weight loss temperature (° C.) | 315 | 295 | 330 | 315 | 315 | 330 | 370 |

TABLE 5

| Amount (pbw) | Comparative Example | | | | | | |
|---|---|---|---|---|---|---|---|
| | 8 | 9 | 10 | 11 | 12 | 13 | 14 |
| EOCN1020 | 32.67 | 62.67 | 12.67 | 30.00 | 33.00 | 30.00 | 33.00 |
| TD2131 | 16.33 | 31.33 | 6.33 | 15.00 | 16.50 | 15.00 | 16.50 |
| TPP-K | 1.00 | 1.00 | 1.00 | 5.00 | 0.50 | 5.00 | 0.50 |
| SE4 solids | 50.00 | 5.00 | 80.00 | 50.00 | 50.00 | | |
| SE5 solids | | | | | | 50.00 | 50.00 |
| Measurement results | | | | | | | |
| Tg (° C.) | 80 | 115 | 55 | 80 | 80 | 80 | 80 |
| Young's modulus (MPas) | 1300 | 2400 | 600 | 1300 | 1300 | 1300 | 1300 |
| Bond strength (kgf/cm) | 1.1 | 1.3 | 0.9 | 1.1 | 1.1 | 1.1 | 1.1 |
| 5% weight loss temperature (° C.) | 305 | 290 | 315 | 305 | 305 | 305 | 305 |

The heat resistant resin compositions of the invention are applicable as varnishes, adhesives and adhesive films where adhesion and heat resistance are required, and can find use in a wide variety of industries including paint, circuit board, electric, automotive, and building industries. As compared with prior art resins, the heat resistant resin compositions of the invention have good heat resistance and are also improved in drying, film formation and electric properties.

When the adhesive film of the invention is used as an insulating adhesive between layers, it prevents mechanical properties from being degraded by heating and improves interlaminar insulation resistance and reliability against heat. The adhesive film can be used even in the high-temperature process to which prior art resin compositions have never been applicable.

Japanese Patent Application No. 2002-135505 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A heat resistant resin composition comprising
the associated product of a polyimide resin having phenolic hydroxyl groups in the skeleton with a quaternary organophosphorus curing catalyst for epoxy resin of the following general formula:

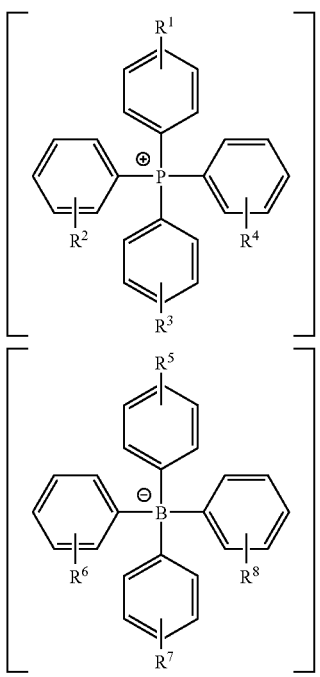

wherein $R^1$ to $R^8$, which may be the same or different, are selected from hydrogen atoms, halogen atoms, and unsubstituted or halo-substituted monovalent hydrocarbon groups which may contain an oxygen atom, an epoxy resin having at least two glycidyl groups in a molecule, and a curing agent for the epoxy resin.

2. The resin composition of claim 1 wherein the curing catalyst for epoxy resin is a tetraorganophosphonium tetraorganoborate catalyst.

3. An adhesive film comprising the heat resistant resin composition of claim 1.

4. The resin composition of claim 1, wherein the polyimide resin having phenolic hydroxyl groups in the skeleton is obtained by reacting a di- or poly-functional acid anhydride component with a mono- or poly-functional amine component having a phenolic hydroxyl group or with a combination of a mono- or poly-functional amine component having a phenolic hydroxyl group and a di- or poly-functional amine component that has no phenolic hydroxyl group.

5. The resin composition of claim 4, wherein the polyimide resin having phenolic hydroxyl groups in the skeleton is obtained by reacting 2,2-bis(3,4-dicarboxyphenyl) hexafluoropropane dianhydride with a combination of 4,4' (3,3'-dihydroxy)diaminobiphenyl and a γ-aminopropyldimethylsiloxy-end blocked dimethylpolysiloxane.

6. The resin composition of claim 1, wherein the amine component having a phenolic hydroxyl group is used in an amount of 5 to 50 mol % of the entire monomeric components to constitute the polyimide resin.

7. The resin composition of claim 2, wherein the curing catalyst for epoxy resin is a tetraarylphosphonium tetraarylborate.

8. The resin composition of claim 7, wherein the curing catalyst for epoxy resin is tetraphenylphosphonium tetraphenylborate or tetra-p-toluylphosphonium tetraphenylborate.

9. The resin composition of claim 1, wherein the curing catalyst for epoxy resin is added in an amount of 0.2 to 10 parts by weight per 100 parts by weight of the polyimide resin.

10. The resin composition of claim 1, wherein the equivalent ratio of epoxy groups in the epoxy resin to the total of phenolic hydroxyl groups in the polyimide resin+cure effective groups in the epoxy resin-curing agent+effective groups in the epoxy resin-curing catalyst is from 0.8 to 1.2.

11. A heat resistant resin composition comprising the associated product of a polyimide resin having phenolic hydroxyl groups in the skeleton with a quaternary organophosphorus curing catalyst for epoxy resin, wherein said polyimide resin is obtained by reacting 2,2-bis(3,4-dicarboxyphenyl)hexafluoropropane dianhydride with a combination of 4,4'(3,3'-dihydroxy) diaminobiphenyl and a γ-aminopropyldimethylsiloxy-end blocked dimethylpolysiloxane, an epoxy resin having at least two glycidyl groups in a molecule, and a curing agent for the epoxy resin.

12. A heat resistant resin composition comprising the associated product of a polyimide resin having phenolic hydroxyl groups in the skeleton with a tetraphenylphosphonium tetraphenylborate or tetra-p-toluylphosphonium tetraphenylborate curing catalyst for epoxy resin, an epoxy resin having at least two glycidyl groups in a molecule, and a curing agent for the epoxy resin.

* * * * *